US012641712B2

(12) United States Patent     (10) Patent No.:   US 12,641,712 B2

Yazu et al.     (45) Date of Patent:    May 26, 2026

(54) CIRCUIT BOARD AND PRINTED BOARD

(71) Applicant: DENSO CORPORATION, Kariya-city (JP)

(72) Inventors: Eriko Yazu, Kariya-city (JP); Ryosuke Omura, Kariya-city (JP); Kazuki Takahashi, Kariya-city (JP); Kenichi Takeshima, Kariya-city (JP); Yuichiro Sasaki, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 515 days.

(21) Appl. No.: 18/167,491

(22) Filed: Feb. 10, 2023

(65) Prior Publication Data

US 2023/0284373 A1     Sep. 7, 2023

(30) Foreign Application Priority Data

Mar. 2, 2022    (JP) ................................. 2022-032122

(51) Int. Cl.
    *H05K 1/02*       (2006.01)
    *H05K 1/181*      (2026.01)

(52) U.S. Cl.
    CPC ............. *H05K 1/023* (2013.01); *H05K 1/181* (2013.01)

(58) Field of Classification Search
    CPC ...... H05K 1/023; H05K 1/181; H05K 1/0245; H05K 1/0298; H05K 1/0233; H05K 1/025; H05K 2201/0776; H05K 2201/08

USPC ......................................................... 174/260

See application file for complete search history.

(56) References Cited

U.S. PATENT DOCUMENTS

| | | | |
|---|---|---|---|
| 2008/0049410 A1 | 2/2008 | Kawaguchi et al. | |
| 2008/0053686 A1 | 3/2008 | Ishii et al. | |
| 2010/0186227 A1 | 7/2010 | Ishii et al. | |
| 2014/0098501 A1* | 4/2014 | Kawaguchi .......... | H05K 9/0086 174/382 |

FOREIGN PATENT DOCUMENTS

| | | | |
|---|---|---|---|
| JP | H06-275927 A | | 9/1994 |
| JP | 2008204086 A | * | 9/2008 |
| JP | 2009-283901 A | | 12/2009 |
| JP | 2012-227211 A | | 11/2012 |

* cited by examiner

*Primary Examiner* — Timothy J Thompson

(74) *Attorney, Agent, or Firm* — Posz Law Group, PLC

(57) ABSTRACT

In a circuit board, a printed board includes an insulating base and a plurality of conductors disposed in layers in the insulating base. The conductors include a signal line electrically connected to an electronic component; and a potential fixed layer fixed to a predetermined potential and arranged to face the signal line across the insulating base in a thickness direction of the printed board. The potential fixed layer has a facing surface facing the signal line, and is provided with a high magnetic film having a magnetic permeability higher than that of the at least one potential fixed layer on the facing surface. The high magnetic film is disposed to overlap the signal line in the thickness direction. The signal line includes a facing line that faces the high magnetic film across the insulating base in the thickness direction.

18 Claims, 7 Drawing Sheets

CIRCUIT BOARD AND PRINTED BOARD

CROSS REFERENCE TO RELATED APPLICATION

The present application claims the benefit of priority from Japanese Patent Application No. 2022-032122 filed on Mar. 2, 2022. The entire disclosures of the above application are incorporated herein by reference.

TECHNICAL FIELD

The present disclosure relates to a circuit board and a printed board.

BACKGROUND

For example, JP 2012-227211 A discloses a wiring board. The disclosure of JP 2012-227211 A is incorporated herein by reference as an explanation of technical elements in the present disclosure.

SUMMARY

The present disclosure provides a circuit board having a printed board and an electronic component mounted on the printed board. The printed board includes an insulating base and a plurality of conductors disposed in layers in the insulating base. The plurality of conductors includes at least one signal line electrically connected to the electronic component, and at least one potential fixed layer that is fixed to a predetermined potential and disposed to face the at least one signal line across at least a part of the insulating base in a thickness direction of the printed board. The at least one potential fixed layer is provided with a high magnetic film having a higher magnetic permeability than the at least one potential fixed layer on a facing surface facing the at least one signal line.

BRIEF DESCRIPTION OF THE DRAWINGS

Objects, features and advantages of the present disclosure will become more apparent from the following detailed description made with reference to the accompanying drawings, in which.

DETAILED DESCRIPTION

Figure 1:
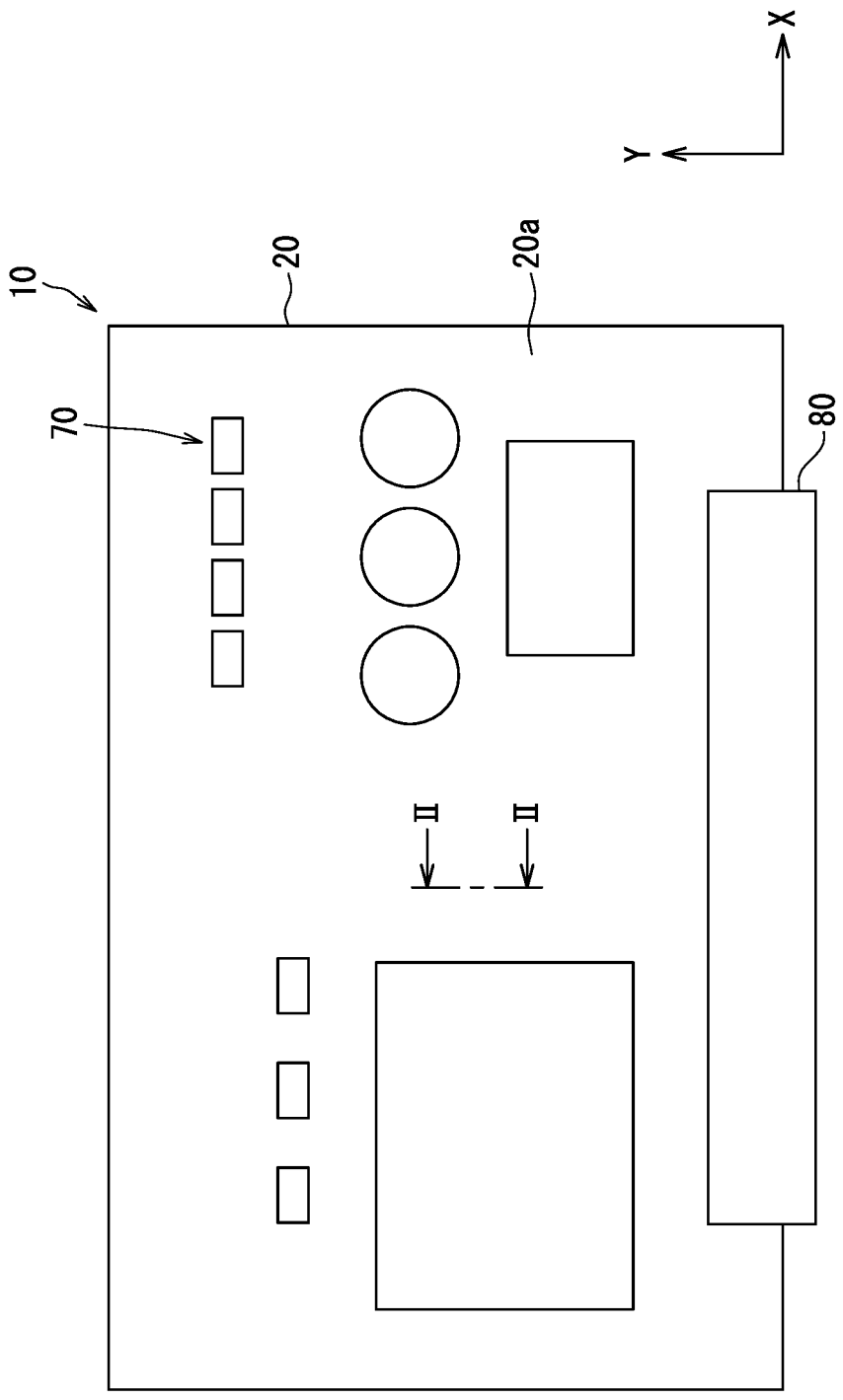
FIG. 1 is a plan view of a circuit board according to a first embodiment of the present disclosure.

In a circuit board or printed board, if an insulating layer provided between a signal wiring and a ground layer is made thinner for size reduction or the like, a coupling capacitance between the signal wiring and the ground layer is increased and the impedance of the signal wiring is decreased. On the other hand, it is conceivable to increase the impedance of the signal wiring by reducing the width of the signal wiring in order to match the impedance with respect to an electronic component. However, there may arise an issue of conductor loss.

For example, it is conceivable to adopt a ground layer having a mesh structure. In such a configuration, the facing area between the signal wiring and the ground layer is reduced, and thus the coupling capacitance can be reduced. However, since electromagnetic waves are likely to leak through openings of the mesh, there may arise an issue of crosstalk. In the printed board or the circuit board, further improvements are required from the viewpoints mentioned above or from other viewpoints not mentioned.

The present disclosure provides a circuit board and a printed board, which are capable of adjusting an impedance while suppressing conductor loss. The present disclosure provides a circuit board and a printed board, which are capable of adjusting impedance without adopting a mesh structure.

According to an aspect of the present disclosure, a circuit board includes a printed board and an electronic component. The printed board has an insulating base and a plurality of conductors disposed in layers in the insulating base. The electronic component is mounted on the printed board. The plurality of conductors includes at least one signal line that is electrically connected to the electronic component, and at least one potential fixed layer that is fixed to a predetermined potential and arranged to face the at least one signal line across at least a part of the insulating base in a thickness direction of the printed board. The at least one potential fixed layer has a facing surface facing the at least one signal line, and is provided with a high magnetic film having a magnetic permeability higher than that of the at least one potential fixed layer on the facing surface. The high magnetic film is disposed to overlap the at least one signal line in the thickness direction. The at least one signal line includes a facing line that faces the high magnetic film across the at least the part of the insulating base.

According to another aspect of the present disclosure, a printed board includes an insulating base and a plurality of conductors disposed in layers in the insulating base. The plurality of conductors includes at least one signal line, and at least one potential fixed layer that is fixed to a predetermined potential and arranged to face the at least one signal line across at least a part of the insulating base in a thickness direction of the printed board. The at least one potential fixed layer has a facing surface facing the at least one signal line, and is provided with a high magnetic film having a magnetic permeability higher than that of the at least one potential fixed layer on the facing surface. The high magnetic film is disposed to overlap the at least one signal line in the thickness direction. The at least one signal line includes a facing line that faces the high magnetic film across the at least the part of the insulating base.

As described above, since the high magnetic film is provided on the facing surface of the potential fixed layer at the position overlapping the facing line, the impedance of the facing line can be increased. Since the impedance can be increased without narrowing the width of the facing line, the impedance can be adjusted while suppressing conductor loss. The impedance of the facing line can be adjusted without the potential fixing layer having a mesh structure.

Hereinafter, embodiments of the present disclosure will be described with reference to the drawings. In the embodiments, functionally and/or structurally corresponding and/or associated parts will be assigned with the same reference numerals. For corresponding parts and/or associated parts, additional explanations can be made to the description of other embodiments. When only a part of the configuration is described in each embodiment, the configuration of the other embodiments described so far can be applied to other parts of the configuration. Further, not only the combinations of the configurations explicitly shown in the description of the respective embodiments, but also the configurations of the plurality of embodiments can be partially combined even when they are not explicitly shown as long as there is no difficulty in the combination in particular.

First Embodiment

First, schematic configurations of a printed board and a circuit board will be described.

<Printed Board and Circuit Board>

Figure 2:
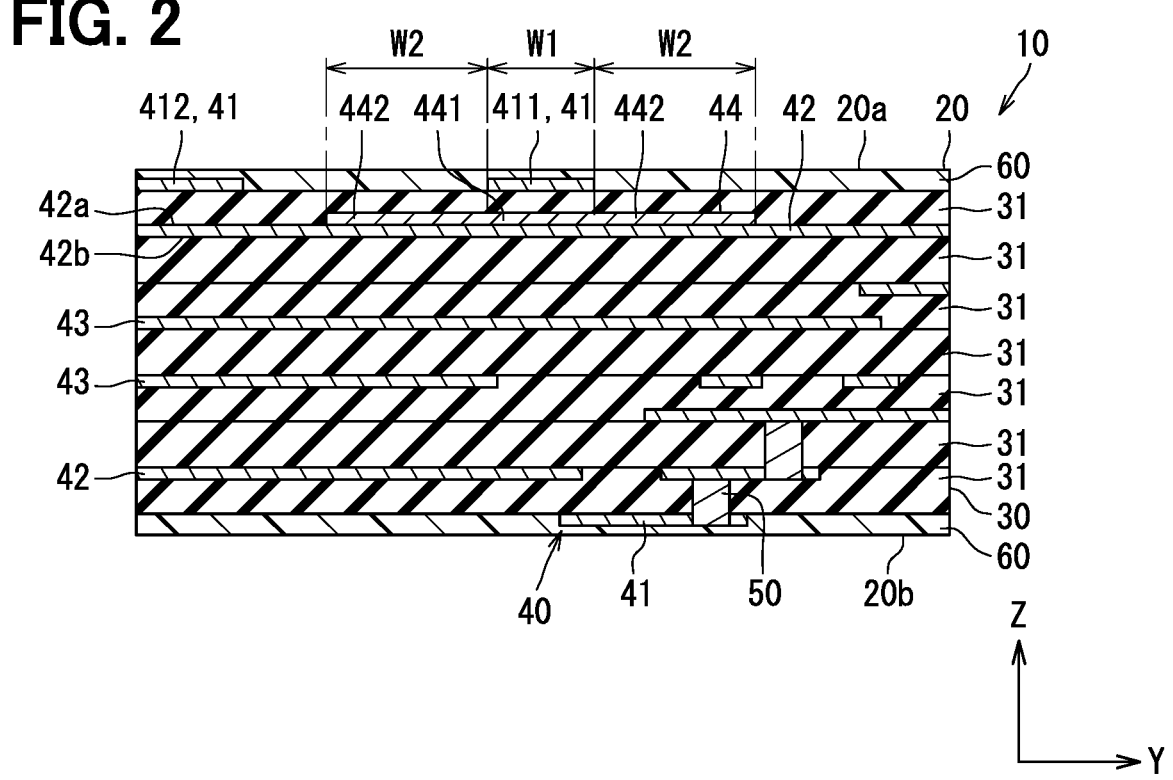
FIG. 2 is a cross-sectional view taken along a line II-II of FIG. 1.

FIG. 1 is a plan view for showing an example of a circuit board. FIG. 2 is a cross-sectional view taken along a line II-II of FIG. 1. FIG. 2 shows a printed board of the circuit board. Hereinafter, a thickness direction of the printed board will be referred to as an Z direction. A direction perpendicular to the Z direction is referred to as an X direction, and a direction perpendicular to the X direction and the Z direction is referred to as a Y direction. Unless otherwise specified, a shape viewed in the Z-direction, that is, a shape along an XY plane defined by the X-direction and Y-direction is referred to as a planar shape. A view when viewed in the Z direction, that is, in the thickness direction will be referred to as a plan view.

As shown in FIGS. 1 and 2, a circuit board 10 includes a printed board 20, electronic components 70, and a connector 80. The connector 80 allows an electrical connection of a circuit provided in the circuit board 10 to an external device.

The printed board 20 is also referred to as a substrate, a wiring board, a printed wiring board, or the like. The printed board 20 has a first surface 20a and a second surface 20b opposite to the first surface 20a in the thickness direction (i.e., Z direction). The planar shape of the printed board 20 is not particularly limited. As an example, the printed board 20 has substantially a rectangular shape as the planar shape.

The printed board 20 includes an insulating base 30 and wiring elements arranged in the insulating base 30. The wiring elements include conductors 40 and interlayer connection portions 50. The insulating base 30 is a base member that supports or holds the wiring elements. The insulating base 30 is made of a material having an electrical insulation property such as a resin. Examples of the insulating base 30 may include an insulating base made of only a resin, an insulating base made of a glass cloth, non-woven fabric, or the like in combination with a resin. The insulating base 30 is provided by a stack of multiple insulating layers 31. A thickness direction of the insulating base 30 coincides with the thickness direction (i.e., Z direction) of the printed board 20.

The wiring elements, which include the conductors 40 and the interlayer connection portions 50, provide the circuit together with the electronic components 70 mounted on the printed board 20. The conductor 40 is also referred to as a conductor pattern, a wiring pattern, a conductor layer, a wiring layer, or the like. In the insulating base 30, multiple conductors 40 are arranged in layers in the Z direction. That is, the printed board 20 is a multilayer board. The conductors 40 are formed, for example, by patterning a metal foil. For example, the metal foil is a copper foil. The conductors 40 include a surface layer conductor arranged at a surface of the insulating base 30 and an inner layer conductor arranged inside the insulating base 30.

The configuration in which the conductors 40 are arranged in multiple layers in the insulating base 30 can be realized by stacking multiple insulating layers 31 each having the conductor 40 on its surface at least on one side. For example, the printed board 20 may be provided by stacking only the insulating layers 31 each having the conductor 40 on its surface. As another example, the printed board 20 may be provided by stacking the insulating layers 31 having the conductors 40 thereon and the insulating layers 31 having no conductors 40 on their both sides. For example, the printed board 20 may have a configuration in which the insulating layer 31 having no conductors 40 on both sides be arranged between the insulating layers 31 having the conductors 40 thereon. The timing of patterning the conductors 40 can be appropriately selected according to a manufacturing method. The patterning of the conductors 40 may be performed to the individual insulating layer 31 before the insulating layers 31 are stacked. As another example, the patterning of the conductors 40 may be performed in a state after the insulating layers 31 are stacked.

The conductors 40 includes a signal line 41, a ground layer 42 and a power supply layer 43. The signal line 41 is also referred to as a signal wiring, a signal pattern, or the like. The signal line 41 is electrically connected to the electronic component 70. Multiple signal lines 41 are arranged in the insulating base 30. The arrangement and the number of layers of the signal lines 41 are not particularly limited. As an example, the signal lines 41 are arranged in multiple layers in the insulating base 30.

Each of the ground layer 42 and the power supply layer 43 is fixed at a predetermined potential through the connector 80. The ground layer 42 and the power supply layer 43 correspond to potential fixed layers. In the following description, the ground layer 42 and the power supply layer 43 may be referred to as potential fixed layers 42 and 43. The ground layer 42 provides a ground potential in the circuit board 10 or in the printed board 20. The power supply layer 43 provides a power supply potential in the circuit board 10.

The arrangement of the ground layer 42 and the arrangement of the power supply layer 43 are not particularly limited. The number of layers of the ground layer 42 and the number of layers of the power supply layer 43 are not particularly limited. As an example, the ground layers 42 are arranged in multiple layers. Similarly, the power supply layers 43 are arranged in multiple layers. At least one of the ground layer 42 and the power supply layer 43 is arranged to face at least one signal line 41 via the insulating base 30, that is, via the insulating layer 31.

The interlayer connection portion 50 electrically connects the conductors 40 arranged in different layers. The interlayer connection portion 50 is also referred to as a via conductor, connection via, or the like. The interlayer connection portion 50 is provided by placing a conductor such as plating in a via hole. The printed board 20 may have a through-hole (not shown) as other circuit elements. The through hole is formed by plating a wall surface of a hole passing through the printed board 20. The through-hole is also referred to as a through-hole plating. The through-hole receives a terminal of the electronic component 70 therein. A conductor on the wall surface of the through-hole and the terminal of the electronic component 70 are connected with a joining material such as solder.

The printed board 20 further includes a resist 60. The resist 60 protects the wiring elements of the printed board 20. The resist 60 is also referred to as a solder resist, a protective film, or the like. The resist 60 is arranged on a first surface 20a and/or a second surface 20b of the printed board 20. The resist 60 covers the wiring elements arranged on the surface layer, excluding lands (not shown). As an example, the resist 60 is arranged on the first surface 20a as well as the second surface 20b.

Figure 8:
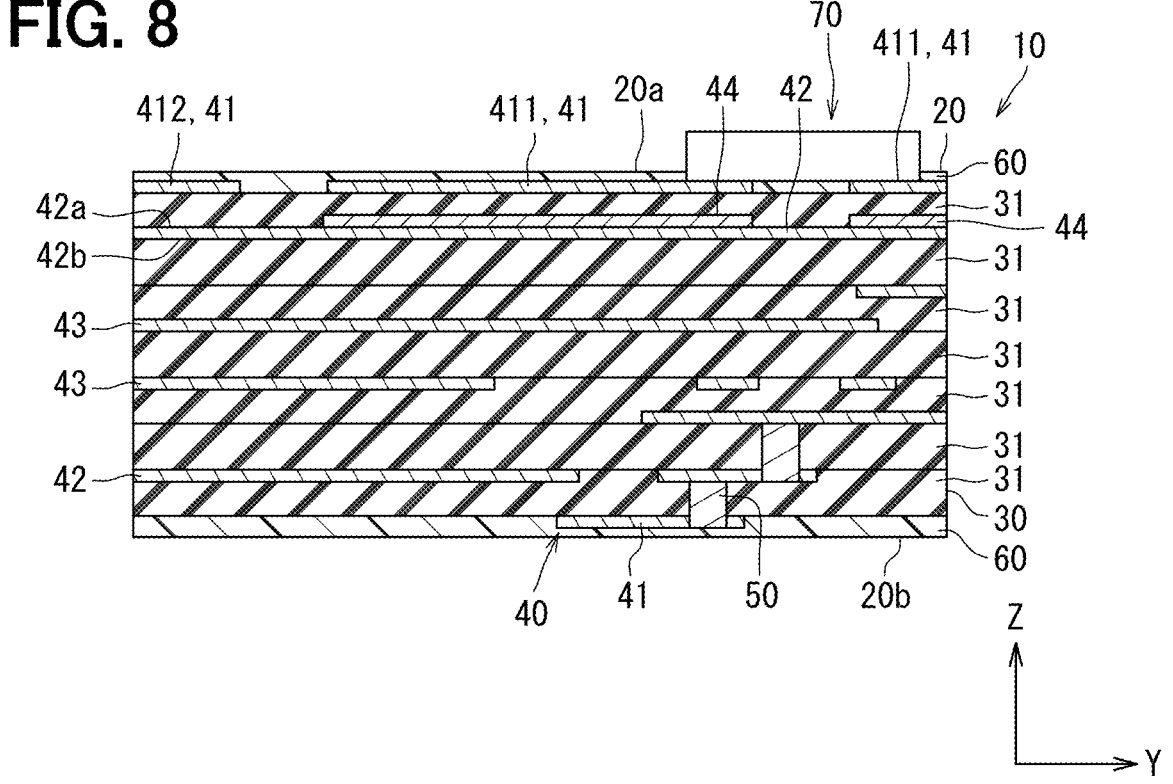
FIG. 8 is a cross-sectional view of a circuit board for showing an electronic component mounted on a printed board.

The-As seen in FIG. 8, the electronic component 70 is mounted on the printed board 20. As seen in FIG. 1, multiple electronic components 70 are mounted on the printed board 20. The electronic components 70 are generally arranged on the first surface 20a and/or the second surface 20b of the printed board 20. One or more of the electronic components 70 may be embedded in the insulating base 30. The electronic component 70 forms the circuit together with the wiring elements such as the conductors 40 and the interlayer connection portions 50 as described above. The circuit board 10 has the electronic components 70 in order to provide predetermined functions.

High Magnetic Film and Facing Line

Next, a high magnetic film and a facing line will be described with reference to FIGS. 2 and 3. Hereinafter, of the multiple conductors 40 arranged in layers, the conductor 40 arranged at the surface layer adjacent to the first surface 20a of the printed board 20 is regarded as the conductor 40 in a first layer.

As shown in FIG. 2, at least one of the potential fixed layers 42 and 43 arranged to face the signal line 41 across at least a part of the insulating base 30, that is, across at least one insulating layer 31 has a high magnetic film 44 on a surface facing the signal line 41. The high magnetic film 44 has a magnetic permeability higher than that of the potential fixed layers 42 and 43. The high magnetic film 44 has a predetermined thickness. The potential fixed layers 42 and 43 are made of copper (Cu), for example. The high magnetic film 44 is made of a metal having a magnetic permeability higher than that of copper. Examples of the metal having the higher magnetic permeability are nickel (Ni) and cobalt (Co). Nickel has the magnetic permeability of 600 H/m, and copper has the magnetic permeability of 1 H/m. Thus, the magnetic permeability of nickel is higher than the magnetic permeability of copper. The same is applied to cobalt. A nickel alloy or a cobalt alloy may be used as the example of the metal having the higher magnetic permeability. Examples of the alloy include NiP, CoNi, NiFe, CoFe, and AuCo. The high magnetic film 44 is formed by, for example, sputtering, electrolytic plating, or electroless plating. The plating is also referred to as magnetic plating.

In the present embodiment, as an example, the ground layer 42 arranged in the second layer has the high magnetic film 44 on a facing surface 42a facing the signal line 41 in the first layer. The ground layer 42 in the second layer is a so-called solid pattern. The ground layer 42 in the second layer does not have openings unlike the mesh pattern. Thus, the ground layer 42 in the second layer has a flat plate shape having a wider area than the signal line 41. The ground layer 42 as the solid pattern will also be referred to as a solid ground. The ground layer 42 in the second layer does not have the high magnetic film 44 on a back surface 42b opposite to the facing surface 42a.

The high magnetic film 44 is arranged so as to overlap or correspond to at least one of the signal lines 41 arranged in the first layer in the plan view, that is, in the thickness direction. In an example shown in FIG. 2, of the multiple signal lines 41 arranged in the first layer, one is a facing line 411 facing the high magnetic film 44, and the other is a signal line 412 different from the facing line 411. The facing line 411 faces the high magnetic film 44 across one insulating layer 31 interposed between the facing line 411 and the high magnetic film 44. The signal line 412 is a non-facing line that does not face the high magnetic film 44.

The high magnetic film 44 has an overlapping region 441 and a peripheral region 442. The overlapping region 441 is a region that overlaps with the facing line 411 in the plan view. The overlapping region 441 is a region directly below the facing line 411. The peripheral region 442 is a region that continues to the overlapping region 441. The peripheral region 442 is a region that extends from the overlapping region 441 and is located on the periphery of the overlapping region 441. The peripheral region 442 is a non-overlapping region that does not overlap the facing line 411 in the plan view.

The high magnetic film 44 is provided so as to overlap, that is, to correspond to at least a portion of the facing line 411 in the plan view. As an example, the high magnetic film 44 of the present embodiment is provided so as to enclose the facing line 411 provided in the first layer in the plan view. That is, the high magnetic film 44 is provided so as to overlap substantially the entire area of the facing line 411 in the plan view.

Figure 3:
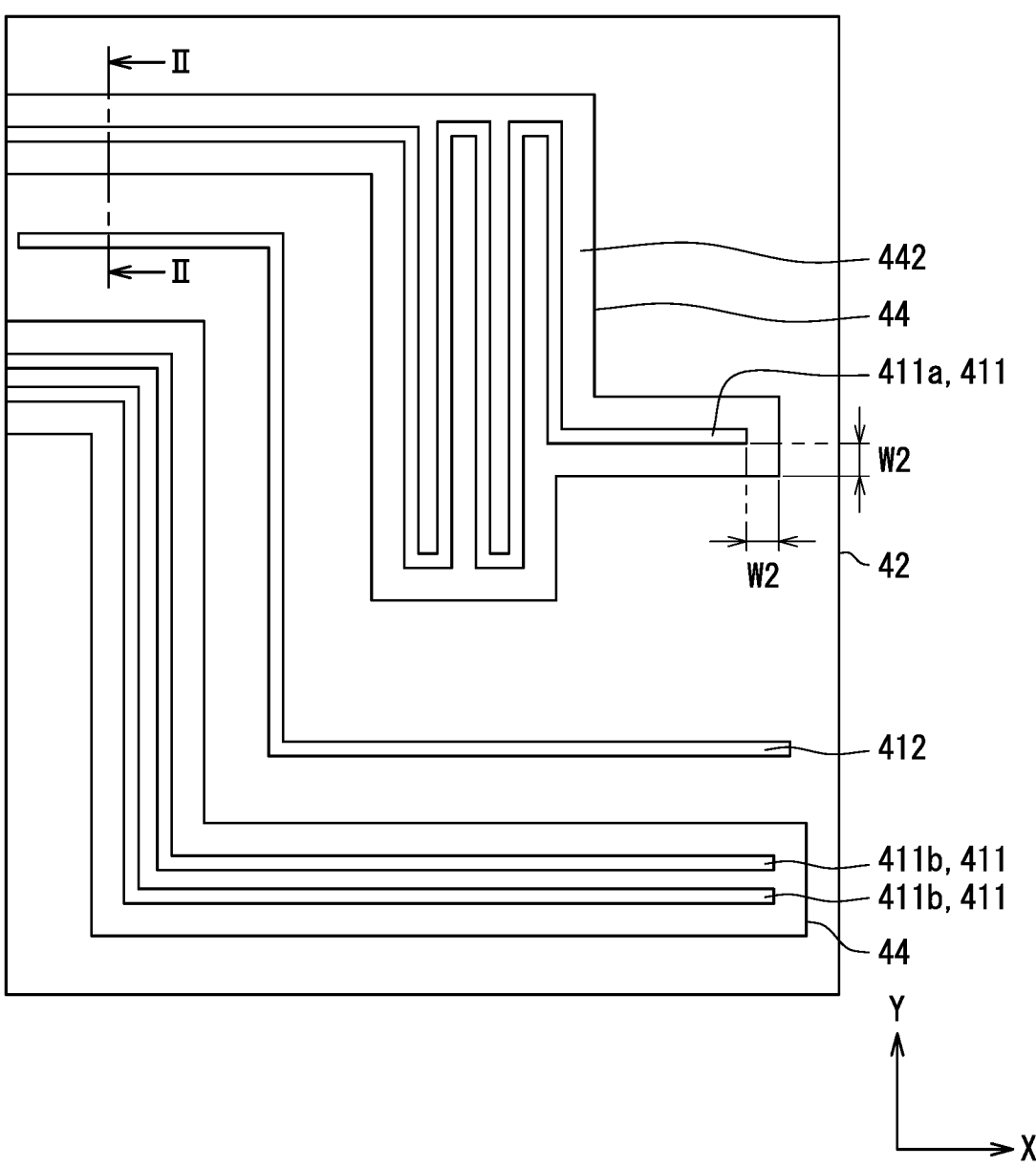
FIG. 3 is a plan view for showing the positional relationship between a signal line, a high magnetic film, and a ground layer.

FIG. 3 shows an example of the multiple signal lines 41 arranged in the first layer. FIG. 3 shows the positional relationship between the signal line 41 including the facing line 411, the high magnetic film 44, and the ground layer 42. In FIG. 3, for the sake of convenience, illustrations of the resist 60 and the insulating base 30 are omitted. In FIG. 3, as in FIG. 2, some of the multiple signal lines 41 arranged in the first layer are provided as the facing lines 411 (411a, 411b), and the rest of the signal lines 41 in the first layer are provided as the signal lines 412. Note that FIG. 2 shows the cross-section taken along a line II-II in FIG. 1 and FIG. 3.

The high magnetic film 44 is provided so as to individually enclose each of the facing lines 411 in the plan view. The high magnetic film 44 is provided so as to overlap the facing line 411 over the entire length. Of the facing lines 411, a facing line 411a has a meander wiring portion having a meandering shape. In the meander wiring portion, the interval between adjacent wiring portions (patterns) is narrow. The high magnetic film 44 is provided so as to enclose the entirety of the meander wiring portion. Of the facing lines 411, a facing line 411b provide a pair of differential lines, and the interval between adjacent wiring portions is narrow. The high magnetic film 44 is provided so as to enclose the entirety of the facing line 411b forming the pair of differential lines.

The overlapping region 441 of the present embodiment substantially coincides with the facing line 411 in the plan view. The peripheral region 442 is provided so as to surround the facing line 411, that is, the overlapping region 441 in the plan view. A dimension W2 of the peripheral region 442 from an inner end defining a boundary with the overlapping region 441 to an outer end of the peripheral region 442, that is, the width W2 of the peripheral region 442 is 1.5 times or more the width W1 of the facing line 411. The width W1 of the facing line 411 is the dimension of the facing line 411 in the direction orthogonal to the extending direction (longitudinal direction) of the facing line 411.

Summary of First Embodiment

In the present embodiment, the ground layer 42 as the potential fixed layer, which faces the signal line 41 across at least a part of the insulating base 30 (insulating layer 31), has the high magnetic film 44 on the facing surface 42a facing the signal line 41. The high magnetic film 44 is arranged so as to overlap at least one of the signal lines 41 in the plan view. In other words, the high magnetic film 44 is arranged to correspond to at least one of the signal lines 41 in the thickness direction. The signal line 41 includes the facing line 411 facing the high magnetic film 44 across at least a part of the insulating base 30 interposed therebetween.

Thus, the high magnetic film 44 having a magnetic permeability higher than that of the potential fixed layer is arranged to face the facing line 411. As a result, the inductance of the facing line 411 can be increased, and hence the impedance can be increased. Therefore, the impedance (characteristic impedance) of the facing line 411 can be increased without narrowing the line width. That is, the impedance can be adjusted while suppressing conductor loss. The impedance of the facing line 411 can be adjusted without forming the ground layer 42 into a mesh structure.

For example, even if the coupling capacitance between the facing line 411 and the ground layer 42 is increased resulting from the reduction in thickness of the insulating layer 31 and the impedance of the facing line 411 is decreased, it is possible to increase the impedance of the facing line 411 by employing the high magnetic film 44, and thereby to match the impedance with the electronic component 70.

The impedance of the facing line 411 can be adjusted by the thickness of the high magnetic film 44, for example. The amount of increase in impedance increases with an increase in thickness of the high magnetic film 44.

Figure 4:
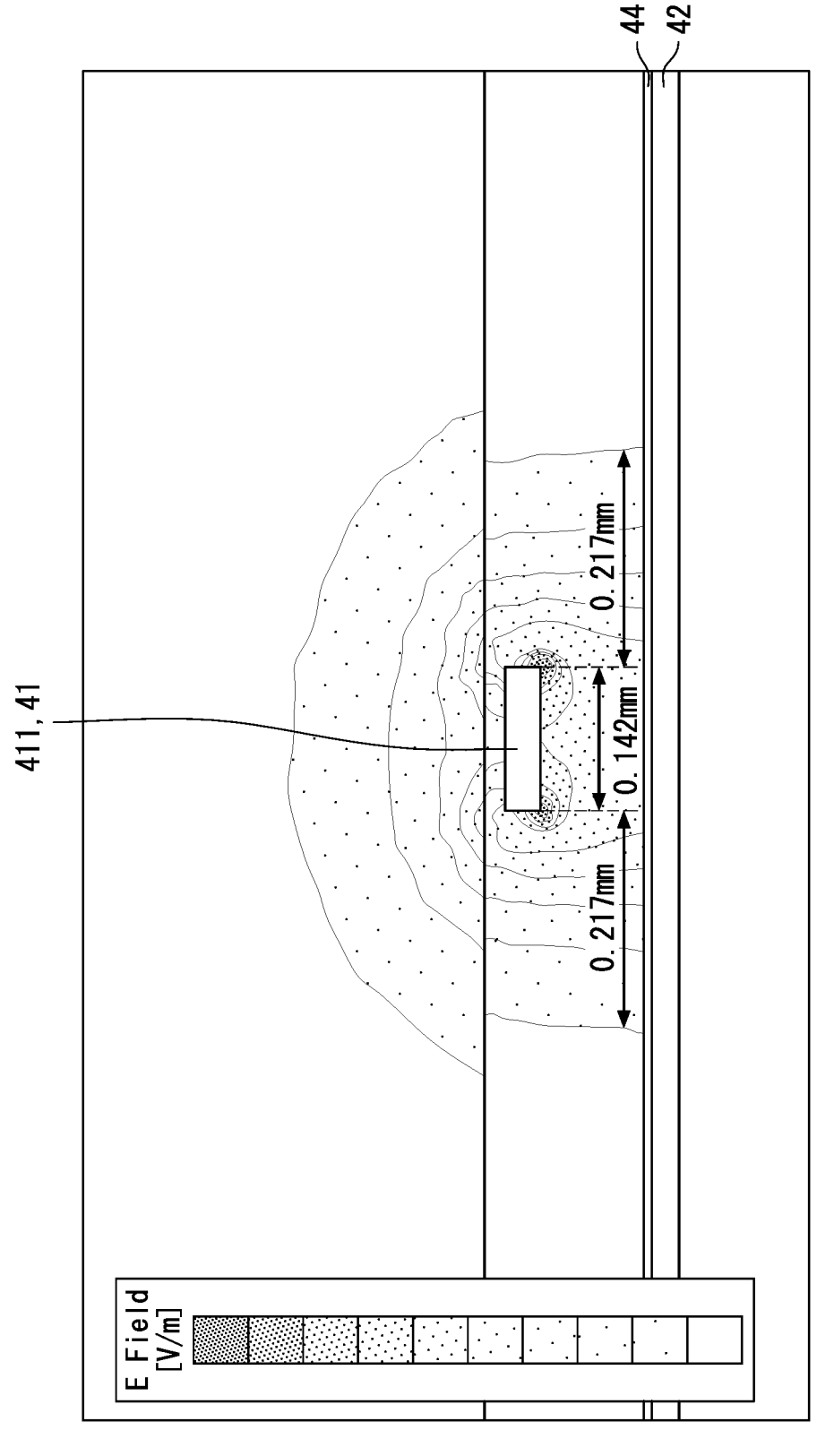
FIG. 4 is a diagram showing results of electromagnetic field simulation.

The high magnetic film 44 may have only the overlapping region 441. The high magnetic film 44 of the present embodiment has the overlapping region 441 and the peripheral region 442. FIG. 4 is a diagram showing results of electromagnetic field simulation. In FIG. 4, the electric field intensity (V/m) is indicated by the density of dots. The high magnetic film 44 is provided on the entirety of the facing surface of the ground layer 42. Electromagnetic waves traveling from the facing line 411 to the ground layer 42 gather in the high magnetic film 44 having the high magnetic permeability. Therefore, as shown in FIG. 4, the range of the radiated electric field from the facing line 411 is narrowed.

In FIG. 4, the width of the facing line 411 is set to 0.142 mm. In this state, the width of a region in which the electric field intensity is high around the facing line 411 in the plan view is 0.217 mm. That is, the width of the high electric field intensity region is approximately 1.5 times the width of the facing line 411. If the high magnetic film 44 is not provided, the range of the radiated electric field spreads. The width of the high electric field intensity region is, for example, about ten times the width of the facing line 411.

As described above, the electric field intensity is high not only directly under the facing line 411 but also in the vicinity thereof. In the present embodiment, since the high magnetic film 44 is provided not only directly under the facing line 411 but also in the region around the facing line 411, the effect of increasing the impedance of the facing line 411 can be enhanced. In particular, since the high magnetic film 44 is provided so as to satisfy the relationship of W2≥1.5×W1, the effect of increasing the impedance of the facing line 411 can be further enhanced.

As described above, the impedance of the facing line 411 can be adjusted also by the width W2 of the peripheral region 442. In addition to the film thickness of the high magnetic film 44, since the parameters for adjusting the impedance are increased, the degree of freedom in design can be improved.

In the present embodiment, the facing line 411 and the signal line 412 are arranged in the same layer. Since the range of the electric field radiated from the facing line 411 is narrowed by the high magnetic film 44, crosstalk between the facing line 411 and the signal line 412 arranged in the same layer can be suppressed. One of the facing line 411 and the signal line 412 corresponds to the first signal line, and the other corresponds to the second signal line.

In the present embodiment, the high magnetic film 44 is arranged so as to overlap the facing line 411 over the entire length. According to such a configuration, the effect of increasing the impedance of the facing line 411 can be enhanced.

Modification

The high magnetic film 44 is provided for the signal line 41 that requires impedance adjustment. As described above, of the multiple signal lines 41 arranged in the same layer, some may be used as the facing lines 411 and the others may be used as the signal lines 412. All of the multiple signal lines 41 arranged in the same layer may be used as the facing lines 411. The facing line 411 and the signal line 412 can be selected depending on the presence or absence of the high magnetic film 44. Therefore, the degree of freedom in designing the signal line 41 can be improved.

The impedance of the facing line 411 can be adjusted also by the size of the area of the high magnetic film 44, that is, the size of the overlapping region 441 with respect to the facing line 411. The amount of increase in impedance increases with an increase in the area of the high magnetic film 44.

Figure 5:
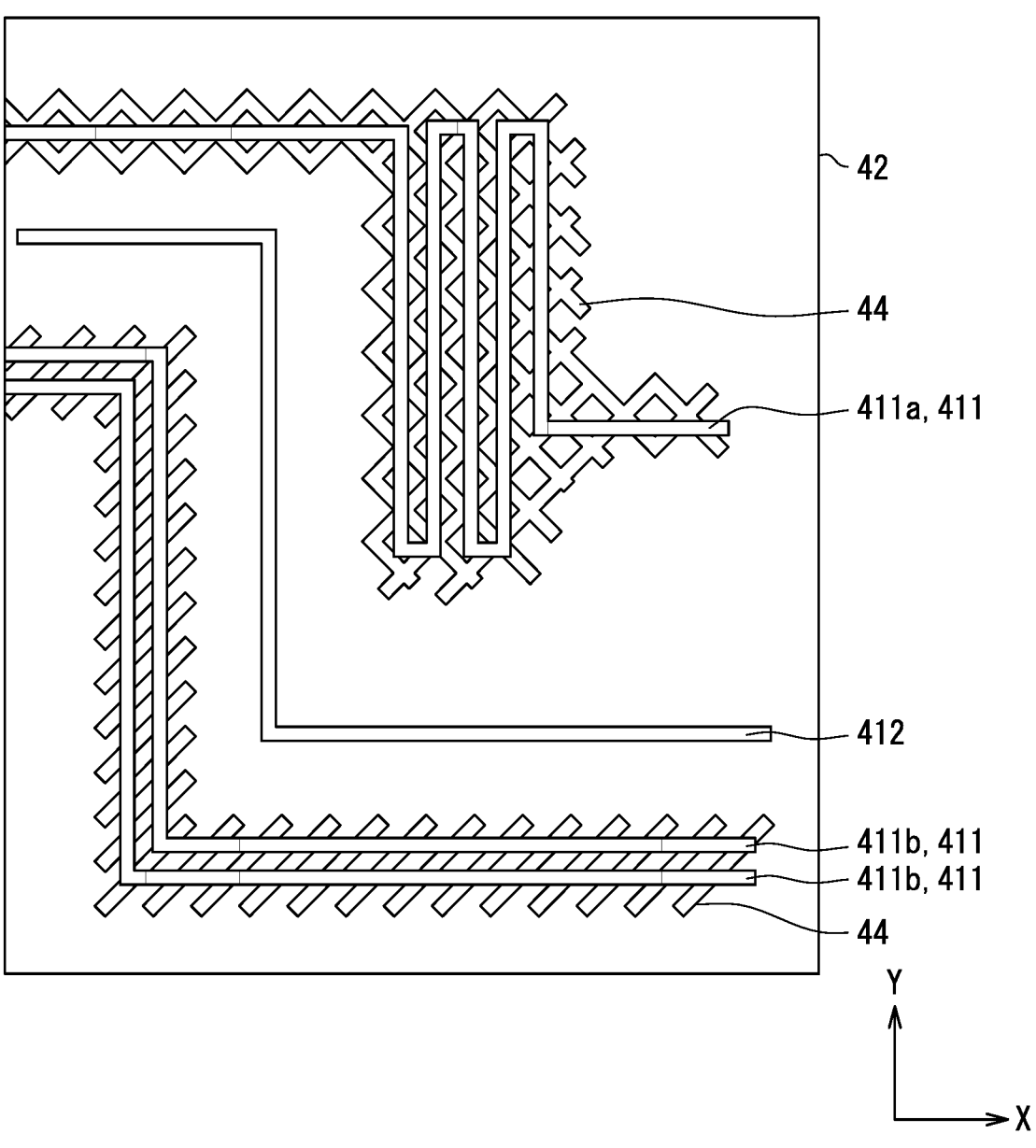
FIG. 5 is a plan view for showing a modification of an arrangement of the high magnetic film.

For example, as shown in FIG. 5, the high magnetic film 44 may be provided so as to partially overlap along the entire length of the facing line 411. In an example shown in FIG. 5, the high magnetic film 44 corresponding to the facing line 411a has a mesh pattern, and the high magnetic film 44 corresponding to the facing line 411b has a stripe pattern. The high magnetic film 44 having the mesh pattern and the high magnetic film 44 having the stripe pattern can be formed by patterning using a mask. In the high magnetic film 44 having the stripe pattern, the extending direction of the stripes is not limited to the direction shown in FIG. 5. The extending direction of the stripes may be, for example, the X direction or the Y direction.

By adjusting the area of the high magnetic film 44 in this manner, the impedance can be adjusted. In addition to the film thickness of the high magnetic film 44, the parameters for adjusting the impedance are increased, so the degree of freedom in design can be improved. The pattern of the high magnetic film 44 that partially overlaps along the entire length of the facing line 411 is not limited to the examples shown in FIG. 5. For example, a dot pattern or the like may be adopted.

Although the example in which the high magnetic films 44 are individually provided for the respective facing lines 411 has been shown hereinabove, the present disclosure is not limited to the example shown. The high magnetic film 44 may be commonly provided for multiple facing lines 411. That is, the high magnetic film 44 may be provided so as to enclose the multiple facing lines 411.

Although the example in which the high magnetic film 44 is arranged on the ground layer 42 in the second layer and some of the signal lines 41 in the first layer are used as the facing lines 411 has been shown hereinabove, the present disclosure is not limited to the example shown. The potential fixed layer provided with the high magnetic film 44 is not limited to the ground layer 42. The high magnetic film 44 may be provided on the power supply layer 43. The high magnetic film 44 may be provided on the ground layer 42 as well as the power supply layer 43. The signal line 41 arranged in a layer other than the first layer may be used as the facing line 411.

Second Embodiment

A second embodiment is a modification of the preceding embodiment as a basic configuration and may incorporate description of the preceding embodiment.

Figure 6:
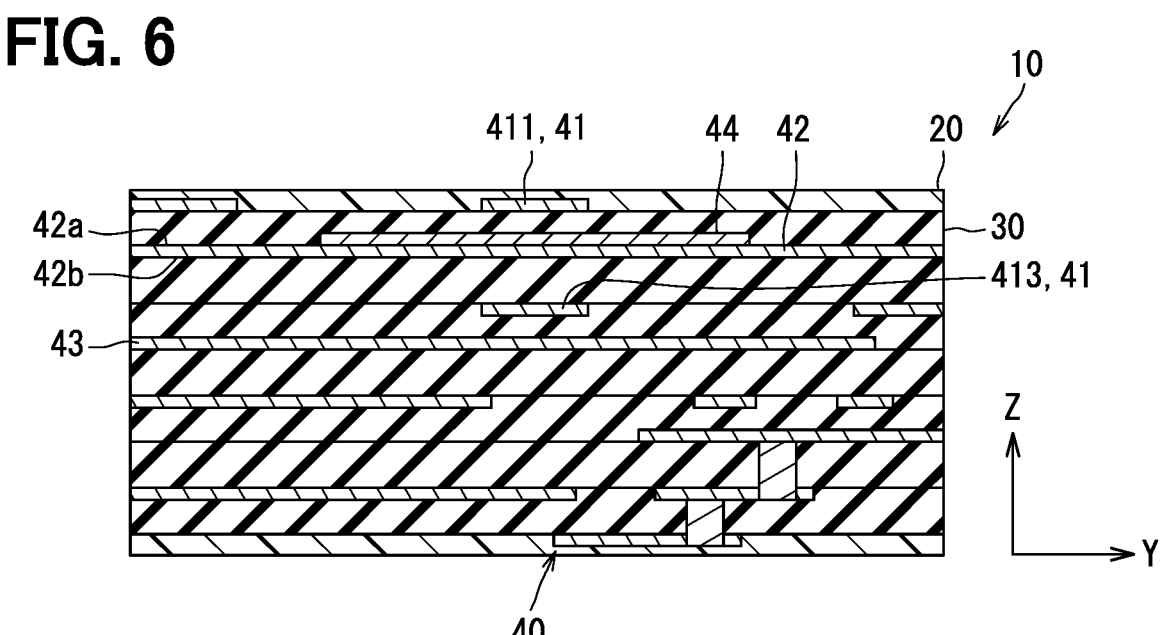
FIG. 6 is a cross-sectional view of a circuit board according to a second embodiment of the present disclosure.

FIG. 6 is a cross-sectional view showing a circuit board 10 according to the second embodiment. FIG. 6 is the cross-sectional view of a part corresponding to the cross-sectional view shown in FIG. 2. FIG. 6 shows a printed board 20 of the circuit board 10. In FIG. 6, a signal line 413 different from the facing line 411 is provided in the third layer. The signal line 413 does not face the high magnetic film 44 provided on the ground layer 42 in the second layer. The signal line 413 is arranged so as to interpose the ground layer 42 in the second layer provided with the high magnetic film 44 between the signal line 413 and the facing line 411. That is, the ground layer 42 on which the high magnetic film 44 is provided is disposed between the facing line 411 and the signal line 413 in the thickness direction. At least a part of the signal line 413 overlaps the high magnetic film 44 in the plan view. A part of the signal line 413 overlaps the facing line 411 in the plan view. The ground layer 42 in the second layer is a solid pattern, similar to the ground layer 42 in the first embodiment. One of the facing line 411 and the signal line 413 corresponds to the third signal line, and the other corresponds to the fourth signal line. Other configurations are the same as those exemplified in the first embodiments.

Summary of Second Embodiment

If the potential fixed layer has a mesh structure, electromagnetic waves may leak through openings in the mesh. In other words, crosstalk may occur between the signal lines that are arranged at the opposite sides of the potential fixed layer in the thickness direction. In particular, if the insulating layer interposed between the signal line and the potential fixed layer is thin, crosstalk is likely to occur.

In the present embodiment, the ground layer 42 having the high magnetic film 44 is the solid pattern. Therefore, crosstalk between the facing line 411 and the signal line 413, which are arranged in different layers so as to interpose the ground layer 42 therebetween can be suppressed.

Although the example in which the signal line 413 is a non-facing line that does not face the high magnetic film 44 has been shown hereinabove, the present disclosure is not limited to the example shown. For example, the signal line 413 may be used as the facing line 411 by providing the high magnetic film 44 on the surface of the power supply layer 43 located in the fourth layer, the surface facing the signal line 413. In other words, the signal lines 41 arranged in different layers and located at opposite sides with respect to the ground layer 42 in the thickness direction may be both used as the facing lines 411.

Third Embodiment

A third embodiment is a modification of the preceding embodiments as a basic configuration and may incorporate description of the preceding embodiments.

Figure 7:
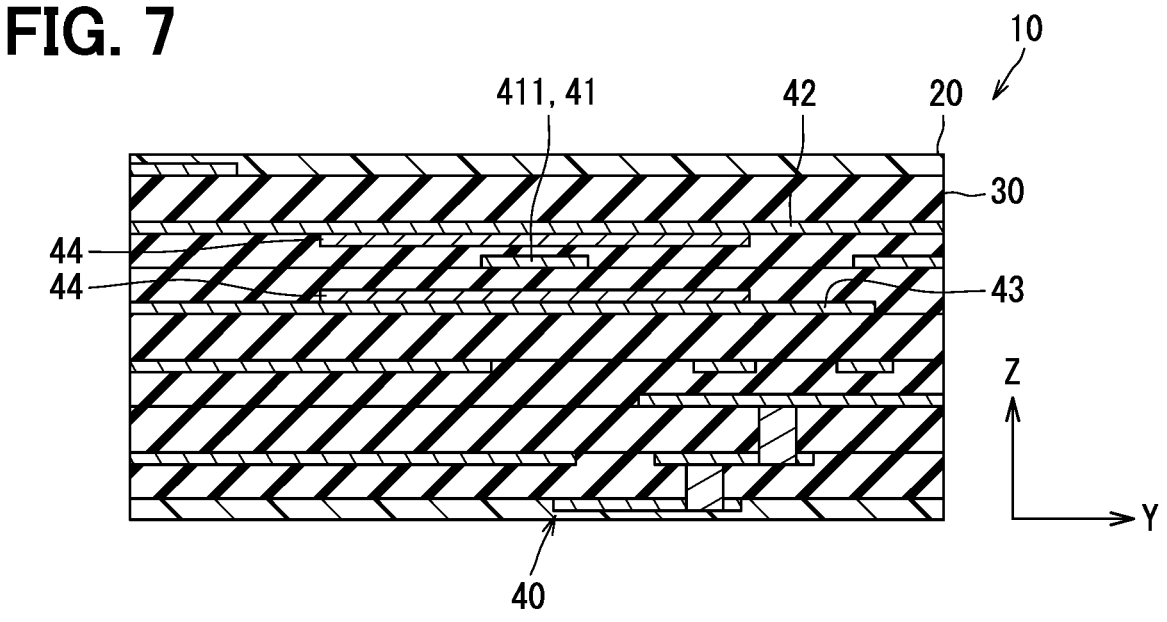
FIG. 7 is a cross-sectional view of a circuit board according to a third embodiment of the present.

FIG. 7 is a cross-sectional view showing a circuit board 10 according to the third embodiment. FIG. 7 is the cross-sectional view of a part corresponding to the cross-sectional view shown in FIG. 2. FIG. 7 shows a printed board 20 of the circuit board 10. In FIG. 7, the facing line 411 is arranged in the third layer. The high magnetic film 44 is provided on the surface of the ground layer 42 located in the second layer, the surface facing the facing line 411. The high magnetic film 44 is also provided on the surface of the power supply layer 43 located in the fourth layer, the surface facing the facing line 411. The potential fixed layers 42 and 43 are arranged in different layers so as to interpose the facing line 411 therebetween. One of the potential fixed layers 42 and 43 corresponds to the first potential fixed layer, and the other one corresponds to the second potential fixed layer. Other configurations are the same as those exemplified in the preceding embodiments.

Summary of Third Embodiment

In the present embodiment, the facing line 411 is arranged inside the insulating base 30. The ground layer 42 is arranged so as to face the facing line 411 as an inner layer conductor across the insulating layer 31 interposed therebetween. The ground layer 42 is provided with the high magnetic film 44, and the high magnetic film 44 overlaps the facing line 411 in the plan view, that is, in the thickness direction. The facing line 411 faces the high magnetic film 44 provided on the ground layer 42. Therefore, the similar effects to those of the preceding embodiments can be obtained.

In the present embodiment, the power supply layer 43 is also arranged so as to face the facing line 411 across the insulating layer 31 interposed therebetween. The power supply layer 43 is provided with the high magnetic film 44, and the high magnetic film 44 overlaps the facing line 411 in the plan view, that is, in the thickness direction. The facing line 411 faces the high magnetic film 44 provided on the power supply layer 43. In other words, the high magnetic films 44 are respectively provided on both of the potential fixed layers 42 and 43 that are arranged on opposite sides of the facing line 411 in the thickness direction. According to such a configuration, the impedance of the facing line 411 can be further increased.

The high magnetic film 44 may be provided on at least one of the potential fixed layers 42 and 43 arranged on opposite sides of the facing line 411 in the thickness direction. For example, the high magnetic film 44 may be provided only on one of the potential fixed layers 42 and 43. The impedance of the facing line 411 changes according to the number of surfaces of the potential fixed layers 42 and 43 on which the high magnetic films 44 are provided. In addition to the film thickness of the high magnetic film 44, the parameters for adjusting the impedance are increased, so the degree of freedom in design can be improved.

The potential fixed layers arranged on opposite sides of the facing line 411 are not limited to the combination of the ground layer 42 and the power supply layer 43. For example, the facing line 411 may be arranged between the ground layers 42. Alternatively, the facing line 411 may be arranged between the power supply layers 43.

Other Embodiments

The present disclosure in the specification, the drawings and the like is not limited to the embodiments exemplified hereinabove. The present disclosure encompasses the exemplified embodiments and modifications thereof by those skilled in the art. For example, the present disclosure is not limited to the parts and/or combinations of elements shown in the embodiments. The present disclosure may be implemented in various combinations thereof. The present disclosure may have additional parts that may be added to the embodiments. The present disclosure encompasses modifications in which components and/or elements are omitted from the embodiments. The present disclosure encompasses the replacement or combination of components and/or elements between one embodiment and another. The technical scopes disclosed in the present disclosure are not limited to the description of the embodiments. The several technical scopes disclosed are indicated by the description of the claims, and should be further understood to include meanings equivalent to the description of the claims and all modifications within the scope.

The present disclosure in the specification, the drawings and the like is not limited by the description of the claims. The disclosure in the specification, the drawings, and the like encompasses the technical ideas described in the claims, and further extends to a wider variety of technical ideas than those in the claims. Therefore, various technical ideas can be extracted from the disclosure of the specification, the drawings and the like without being limited to the description of the claims.

Spatial relative terms "below", "above", etc. are used herein to facilitate the description that describes relationships between one element or feature and another element or feature. Spatial relative terms can be intended to include different orientations of a device in use or operation, in addition to the orientations depicted in the drawings. For example, when the device in the figure is flipped over, an element described as "below" another element or feature is directed "above" the other element or feature. Therefore, the term "below" can include both above and below. The device may be oriented in another direction (rotated 90 degrees or in any other direction) and the spatially relative terms used herein are interpreted accordingly.

What is claimed is:

1. A circuit board comprising:
a printed board that includes an insulating base and a plurality of conductors disposed in layers in the insulating base; and
an electronic component that is mounted on the printed board, wherein
the plurality of conductors includes:
at least one signal line electrically connected to the electronic component; and
at least one potential fixed layer fixed to a predetermined potential and arranged to face the at least one signal line across at least a part of the insulating base in a thickness direction of the printed board,
the at least one potential fixed layer has a facing surface facing the at least one signal line, and is provided with a high magnetic film on the facing surface,
the at least one signal line includes a facing line that faces the high magnetic film across the at least the part of the insulating base in the thickness direction,
the high magnetic film has a magnetic permeability higher than that of the at least one potential fixed layer, thereby increasing an impedance of the facing line, and
the high magnetic film is disposed to overlap the facing line in the thickness direction.

2. The circuit board according to claim 1, wherein
the at least one potential fixed layer includes a first potential fixed layer and a second potential fixed layer, the first potential fixed layer and the second potential fixed layer are disposed in different layers and interpose the facing line therebetween in the thickness direction, and
the high magnetic film is provided on at least one of the first potential fixed layer and the second potential fixed layer.

3. The circuit board according to claim 1, wherein
the high magnetic film includes an overlapping region overlapping the facing line in the thickness direction and a peripheral region connecting to the overlapping region.

4. The circuit board according to claim 3, wherein
the peripheral region has a dimension defined from a boundary with the overlapping region to an outer end opposite to the overlapping region, and the dimension of the peripheral region is 1.5 times or more a width of the facing line.

5. The circuit board according to claim 1, wherein
the at least one signal line includes a first signal line and a second signal line that are disposed in a same layer, and
the facing line is provided by at least one of the first signal line and the second signal line.

6. The circuit board according to claim 1 wherein
the at least one potential fixed layer provided with the high magnetic film has a solid pattern,
the at least one signal line includes a third signal line and a fourth signal line that are disposed in different layers and interpose the at least one potential fixed layer having the solid pattern therebetween, and
the facing line is provided by at least one of the third signal line and the fourth signal line.

7. The circuit board according to claim 1, wherein
the high magnetic film is disposed to overlap at least a part of an entire length of the facing line.

8. A printed board comprising:
an insulating base; and
a plurality of conductors disposed in layers in the insulating base, wherein
the plurality of conductors includes:
at least one signal line; and
at least one potential fixed layer that is arranged to face the at least one signal line across at least a part of the insulating base in a thickness direction of the insulating base,
the at least one potential fixed layer has a facing surface facing the at least one signal line, and is provided with a high magnetic film on the facing surface,
the at least one signal line includes a facing line that faces the high magnetic film across at least a part of the insulating base,
the high magnetic film has a magnetic permeability higher than that of the at least one potential fixed layer, thereby increasing an impedance of the facing line, and
the high magnetic film is disposed to overlap the facing line in the thickness direction.

9. The circuit board according to claim 1, wherein
the printed board has a substantially rectangular planar shape.

10. The circuit board according to claim 1, wherein
the insulating base is made of only a resin.

11. The circuit board according to claim 1, wherein
the insulating base is made of a resin in combination with one of a glass cloth and a non-woven fabric.

12. The circuit board according to claim 1, wherein at least one of the plurality of conductors comprises a metal foil.

13. The circuit board according to claim 12, wherein the metal foil is a copper foil.

14. The printed board according to claim 8, wherein the shape of the printed board is planar and substantially rectangular.

15. The printed board according to claim 8, wherein the insulating base is made of only a resin.

16. The printed board according to claim 8, wherein the insulating base is made of a resin in combination with one of a glass cloth and a non-woven fabric.

17. The printed board according to claim 8, wherein at least one of the plurality of conductors comprises a metal foil.

18. The printed board according to claim 8, wherein the metal foil is a copper foil.

\* \* \* \* \*